United States Patent
Barkley et al.

(10) Patent No.: US 7,116,151 B2
(45) Date of Patent: Oct. 3, 2006

(54) STRESS TOLERANT HIGH VOLTAGE BACK-TO-BACK SWITCH

(75) Inventors: Gerald J. Barkley, Folsom, CA (US); Daniel J. Chu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 10/883,361

(22) Filed: Jun. 30, 2004

(65) Prior Publication Data

US 2006/0001480 A1 Jan. 5, 2006

(51) Int. Cl.
*H03L 5/00* (2006.01)
(52) U.S. Cl. ...................................... 327/333
(58) Field of Classification Search ................. 326/80, 326/81; 327/318, 319, 333, 530, 534
See application file for complete search history.

(56) References Cited

U.S. PATENT DOCUMENTS 5,748,029 A * 5/1998 Tomasini et al. ........... 327/389
5,973,508 A * 10/1999 Nowak et al. ................ 326/81

* cited by examiner

*Primary Examiner*—Jeffrey Zweizig
(74) *Attorney, Agent, or Firm*—Blakely, Sokoloff, Taylor & Zafman LLP

(57) ABSTRACT

Methods and apparatuses associated with stepping down a high voltage in a high voltage switch. An additional transistor may be coupled to a switching transistor, and the additional transistor biased to a voltage level in between the high voltage to be switched and a switch reference voltage. When the switch is off, the high voltage may thus be spread across multiple devices to prevent a voltage from the gate to the drain to exceed a threshold associated with gate-aided breakdown of the drain-to-substrate channel-side pn-junction.

22 Claims, 2 Drawing Sheets

STRESS TOLERANT HIGH VOLTAGE BACK-TO-BACK SWITCH

RELATED APPLICATION

This Application is related to U.S. patent application Ser. No. 10/335,824, entitled "Providing Protection Against Transistor Junction Breakdown From Supply Voltage," for Taub, and filed on Dec. 31, 2002 now U.S. Pat. No. 6,781,912, and U.S. patent application Ser. No. 10/882,512, entitled "High Voltage Tracking Bias Voltage," for Barkley and Taub, and filed on Jun. 30, 2004, all assigned to the same corporate assignee.

FIELD

Embodiments of the invention relate to high voltage switching and particularly to a high voltage back-to-back switch circuit.

BACKGROUND

Traditionally, Flash memories have used a high voltage power supply of 12V (VPP) to produce large electric fields to move charge on and off the floating gate of the Flash memory transistors for program and erase operations. A high voltage, for example, 12V, provides a fast program and/or erase time. The speed of program and erase is one component of the success of flash memory devices. Many memory devices now exist in which 12V is used, and many circuits designed for such memory devices are hardwired with a fixed 12V supply to the memory devices. For example, many Flash programming devices, which may be generic to a variety of Flash chips from multiple vendors, supply only 12V.

However, metal-oxide-semiconductor (MOS) transistors have voltage limitations that depend on gate length, oxide thickness, and doping implants. The presence of high voltages on the gate of a MOS transistor can cause the depletion region between the drain and substrate to pinch along the inner drain-substrate junction, in the channel underneath the gate. For large values of $|V_{DG}|$, the depletion region is pinched sufficiently to lower the breakdown voltage between the inner drain-substrate pn-junction. This type of breakdown is commonly referred to as gate-aided breakdown of the drain-substrate pn-junction (BVD), and may result in a reverse-bias current flow that could damage the transistor.

In order to improve speed and reduce cost and power, one or more factors (e.g., gate length, oxide thickness, and/or doping implants) are altered. These same factors that affect the speed, cost, and power may also determine the voltage limitations of MOS transistors, and specifically, the BVD limit, or the threshold voltage at which reverse breakdown may occur in a transistor device. The continued drive to improve speed, and reduce cost and power has resulted in MOS transistor devices, such as Flash memories, whose BVD thresholds are lower than the voltage potential of the 12V power supplies traditionally used to power these devices. Thus, circuits that have the entire power supply potential, such as voltage switches, across the circuit face the risk of breakdown because the potential across the circuit exceeds the BVD.

BRIEF DESCRIPTION OF THE DRAWINGS

The description of embodiments of the invention includes various illustrations by way of example, and not by way of limitation in the figures and accompanying drawings, in which like reference numerals refer to similar elements.

DETAILED DESCRIPTION

In a device with a high voltage and a lower voltage, the high voltage may be switched for operation of particular components. When the switch is off, the high voltage, for example, an external high voltage, may not be passed, and components that perform operations with the lower voltage may be electrically isolated from the high voltage. In one embodiment the voltage potential of the high voltage may be high enough to exceed the gate-aided breakdown voltage of the drain to substrate pn-junction (BVD). In a back-to-back configuration switching circuit, the switch in the off state may have substantially the entire voltage potential of the high voltage across the switch. Substantially the entire voltage potential includes the exact voltage level of the high voltage, and may also refer to a voltage high enough to produce similar results in a circuit device as the entire high voltage. Thus, for example, if 10V, 8V, etc. were to exceed the breakdown voltage of the switching circuit, it may be considered substantially the entire voltage potential of the high voltage, if exceeding the breakdown voltage is significant to the circuit and/or circuit design.

To prevent substantially the entire high voltage being across a switching transistor and exceeding the BVD of the switching transistor, one or more additional transistors may be used in conjunction with the switching transistor to drive a circuit with the high voltage. If the additional transistor were properly biased, the voltage potential of the high voltage could be stepped down among the multiple transistors, preventing voltage in excess of the BVD from occurring.

The discussion of the figures below illustrates embodiments of the invention in which reference to one or more "embodiments" may be made. Reference herein to "embodiment" means that a particular feature, structure or characteristic described in connection with the described embodiment is included in at least one embodiment of the invention. Thus, the appearance of phrases such as "in one embodiment," or "in alternate an embodiment" may describe various embodiments of the invention, and may not necessarily all refer to the same embodiment. Various examples may also be provided, which are to be understood as illustrating a feature of an embodiment of the invention, and should not be construed to limit the scope of the invention.

Figure 1:
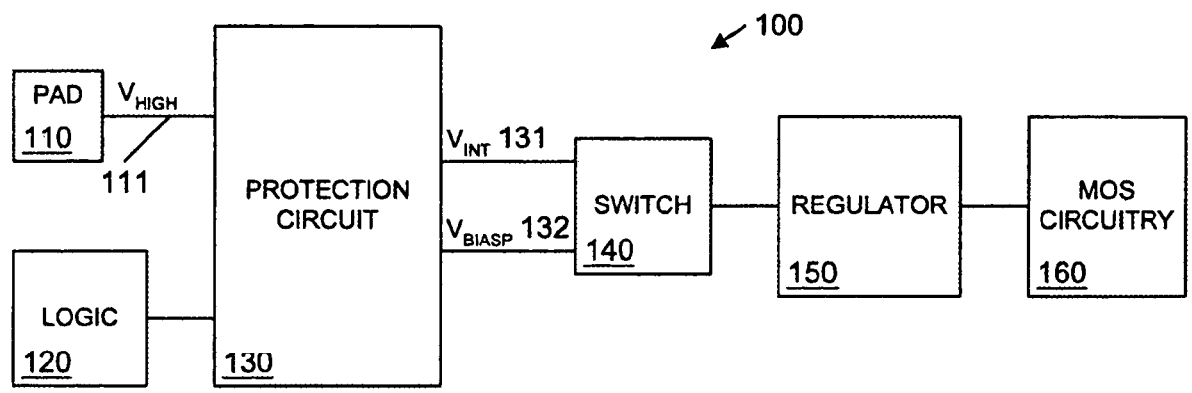
FIG. 1 is a block diagram of a system having a power supply interface and MOS circuitry in accordance with an embodiment of the invention.

FIG. 1 is a block diagram of a system having a power supply interface and MOS circuitry in accordance with an embodiment of the invention. System 100 represents a circuit/electronic system that may be on an integrated circuit chip, a system-on-a-chip, a circuit board, etc. In one embodiment system 100 will have more components than shown in FIG. 1. System 100 has a circuit and/or subsystem that operates with a higher voltage than another subsystem.

Pad 110 represents a pad, pin, interconnect, etc., over which a voltage, $V_{HIGH}$ 111 may be input to system 100. $V_{HIGH}$ 111 may be, for example, a high voltage for certain circuits of system 100 that may operate on higher voltages. An example of a circuit that may operate on a higher voltage than other circuit elements may be a memory element, for example, an electronically erasable programmable read only memory (EEPROM), a Flash, etc. Pad 110 may be a power supply interface, for example, from a battery, a regulated power supply circuit, etc. In one embodiment pad 110 may reside on a circuit board. Alternatively, pad 110 may reside on an integrated circuit chip.

Logic 120 may generate/produce control signals that are provided to protection circuit 130. Control signals may include, among others, signals indicating/controlling a memory read, a memory write, a signal associated with voltage switching (e.g., turning on a transistor), etc. Logic 120 may represent a control circuit that could have one or more circuits, one or more controllers, processors, field programmable gate arrays (FPGAs), discrete components, etc., and/or a control signal received at system 100 from such a device. Logic 120 may be part or all of a circuit and/or have elements in multiple separate circuits that provide control signals.

In one embodiment system 100 may include protection circuit 130 to isolate voltage on pad 110 from a power supply from other components of system 100. In one embodiment system 100 may include elements that do not tolerate a voltage (e.g., suffer breakdown) of the potential of $V_{HIGH}$ 111, and may be electrically isolated to prevent damage to the system. System 100 may include devices/components that operate at a voltage level of the potential of $V_{HIGH}$ 111, and protection circuit 130 operates to provide switching of $V_{HIGH}$ 111 to those circuits. For example, protection circuit 130 may provide bias levels, such as $V_{BIASP}$ 132 depicted in FIG. 1. Protection circuit 130 may also provide $V_{INT}$ 131, which represents an internal voltage of a level appropriate to components that may not tolerate $V_{HIGH}$ 111. Note that protection circuit 130 may consist of multiple components, and may include multiple separate circuits.

In one embodiment protection circuit 130 may generate $V_{BIASP}$ 132 from voltages received and/or from control signals received from logic 120. Protection circuit 130 may also generate $V_{INT}$ 131. Alternatively, protection circuit may receive $V_{INT}$ 131 from another source and supplies the voltage level to other circuits, for example, to switch 140, regulator 150, and/or other circuits that may or may not be shown in FIG. 1.

System 100 may include switch 140, which represents one or more circuits and/or circuit elements to isolate and/or switch a high voltage to a component that may operate at a high voltage level. Switch 140 may receive $V_{INT}$ 131 and/or $V_{BIASP}$ 132 from protection circuit 130, and/or $V_{HIGH}$ 111 or other signals from other components/subsystems of system 100. From the signals received at switch 140 and/or the internal circuitry of switch 140, switch 140 may pass signals to other components. For example, in one embodiment switch 140 may pass $V_{HIGH}$ 11 to regulator 150. Because switch 140 may switch a high voltage, in one embodiment switch 140 has a high voltage potential across the switch in an "off" mode/condition. In a switch "on" mode/condition then, the switching circuitry may be on and may pass the high voltage.

Regulator 150 represents a circuit/component that in one embodiment may be part of system 100 to regulate, filter, buffer, or otherwise manipulate a voltage/power supply. Regulator 150 may provide multiple levels of regulated voltage. In one embodiment regulator 150 may regulate $V_{HIGH}$ 111 received from switch 140. The regulated voltage may be passed to MOS circuitry 160, which represents a metal oxide semiconductor (MOS) circuit. In one embodiment MOS circuitry 160 may be a memory device/element. For example, MOS circuitry 160 could be a bank/array of an EPROM, EEPROM, Flash, etc. For write and/or read applications, a memory element may require a higher voltage than a voltage such as $V_{INT}$ 131 that may power other components (not shown) of system 100. Thus, in one embodiment $V_{HIGH}$ 111 may be a 12V power supply. A 12V power supply may be approximately 12.5V potential from a reference voltage in one example. Switch 140 may thus have a potential of over 12V across a switching circuit.

The processing of the components of switch 140 may result in the components having certain electrical characteristics. In one embodiment the components may have a BVD of less than 12V. For example, the BVD may be approximately 10V, 8V, 6V, etc. In one embodiment switch 140 may include one or more cascaded transistor(s) to step down the high voltage to be switched when the switch is in an off state. $V_{BIASP}$ 132 from protection circuit 130 may operate to bias such a stepping transistor to prevent a drain-to-gate voltage, or $V_{DG}$, across a switching transistor from exceeding the BVD of the transistor, even if the high voltage potential across the switch exceeds the BVD of the transistor. Thus, VBIASP 132 may represent one or more bias reference levels generated to bias step-down transistors. Note that specific reference levels may correspond to specific series step-down transistors. This is further explained with reference to FIGS. 2 and 3.

Figure 2:
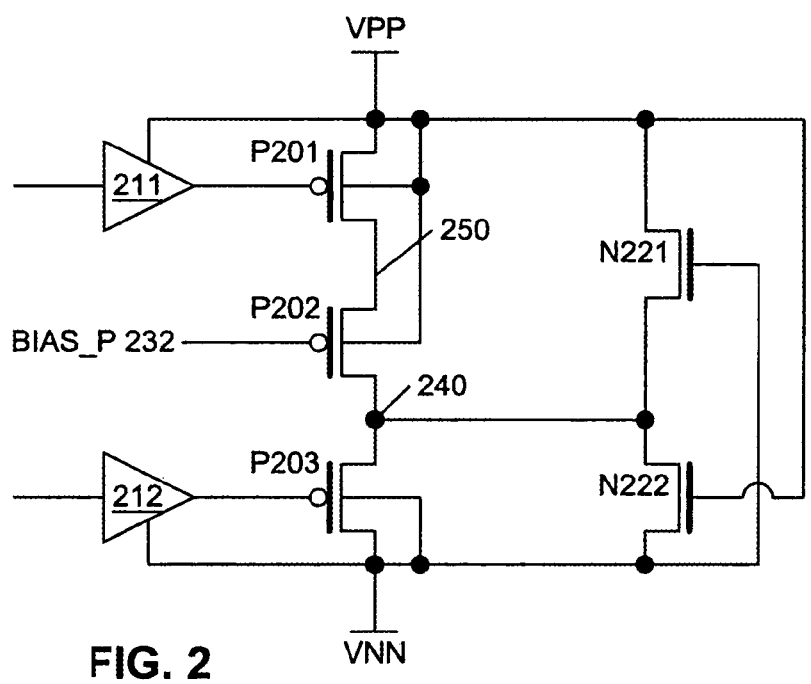
FIG. 2 is a circuit representation of a voltage switching circuit in accordance with an embodiment of the invention.

FIG. 2 is a circuit representation of a voltage switching circuit in accordance with an embodiment of the invention. In one embodiment FIG. 2 represents circuit components that may make up switch 140 of FIG. 1. P-type transistor P201 may provide switching of a voltage, VPP to node 240 when P201 is turned on. Node 240 may be connected to internal devices such as memory. From node 240, VPP passed by transistor P201 may be regulated and/or otherwise manipulated. The source of P201 may be tied/coupled to VPP, as well as the substrate of transistor P201. The drain may be coupled at node 250 with the drain of transistor P202. The operation of transistor P202 will be discussed below. The gate of P201 may be operated by a control signal from bias element 211. Bias element 211 may turn transistor P201 on or off, depending on the desired operation of the switching circuit. In one embodiment element 211 may bias P201 with VPP to turn the transistor off.

Transistor P203 may be in a back-to-back configuration with P201, in that the drains are coupled at node 240. The source and substrate of transistor P203 may be coupled to VNN, while the gate may be controlled by bias element 212. The circuit of FIG. 2 may also include a pair of n-type transistors, N221 and N222 coupled to keep node 240 at the lower potential of VPP or VNN when the switch is off. Thus, transistor N221 may have the drain coupled to VPP, the source coupled to the node 240 at the drain of transistor N222, and the gate coupled to VNN. Transistor N222 may have the gate tied to VPP, and the source tied to VNN. While VPP represents a high voltage, such as an external high voltage to be switched in FIG. 2, VNN represents a lower voltage reference. For example, VNN may be ground, 0V. Alternatively, VNN may be controlled to be a particular voltage level, for example, a voltage of anywhere from 0V to the BVD threshold.

In one embodiment the circuit of FIG. 2 may include transistor P202, coupling the drain of P201 to the drain of P203, at node 240. The source of transistor P202 may be coupled to the drain of P201 to provide a cascaded arrangement. Transistor P202 may be considered to be in a back-to-back configuration transistor P203, in conjunction with transistor P201. Thus, the drain of transistor P202 may be coupled with the drain of P203 at node 240. Transistor P202 may represent one or more transistor devices to step VPP across multiple devices in an off state of the switch. With one or more step-down devices, a voltage in excess of a breakdown voltage may be prevented across any given transistor.

The substrate in one embodiment may be coupled to VPP, with the substrate of P201. In one embodiment the gate of transistor P202 may be biased with signal bias_P 232, which may be switched on and off, and may control whether transistor P202 is on or off. In a case where transistor P202 represents multiple devices, bias_P 232 may represent multiple bias levels, each appropriate to reduce the risk of a BVD violation on the biased device. In one embodiment bias_P 232 may be a constant DC value that is not altered, and the gate of transistor P202 constantly remains at the level of bias_P 232, whether transistor P201 is on or off. Note that with P202 cascaded with P201, the voltage potential of node 240 should not be found at node 250 when the switch is off.

Figure 3:
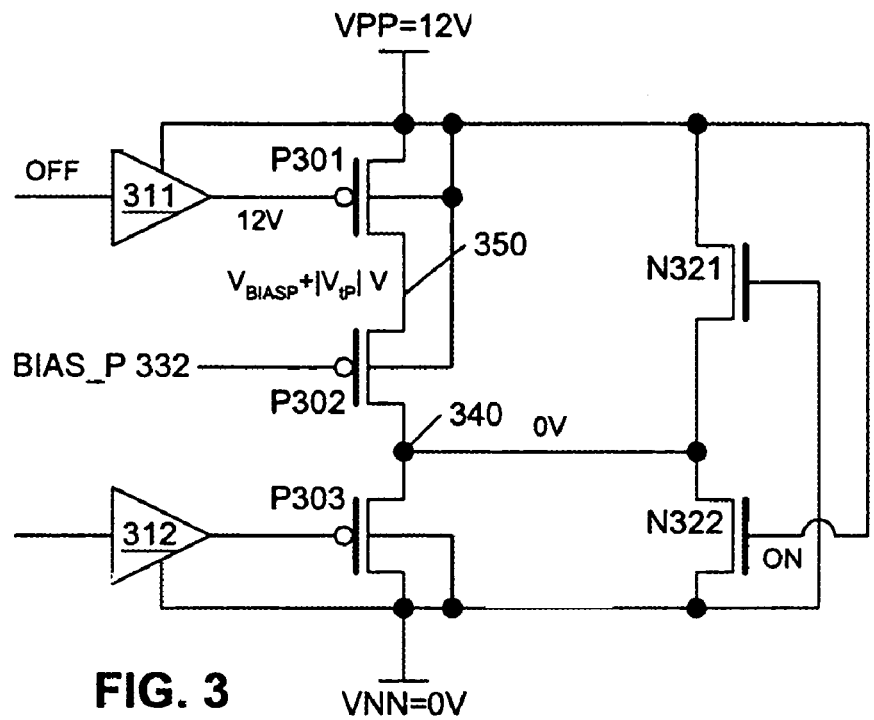
FIG. 3 is an example of a circuit representation of a switching circuit in an off state in accordance with an embodiment of the invention.

FIG. 3 is an example of a circuit representation of a switching circuit in an off state in accordance with an embodiment of the invention. FIG. 3 shows one embodiment of the circuit of FIG. 2 in an off state. Thus, a signal, such as a control signal, to bias element 311 may cause transistor P301 to turn off. In one embodiment element 311 may cause VPP to be 12V onto the gate of P301. Because the gate of transistor P301 is approximately equal to the voltage on the source of P301, the transistor will be off. In one embodiment element 311 may represent a level shifter, receiving a voltage swing (e.g., a signal) at one minimum-maximum swing potential, and output the signal at a different minimum-maximum potential.

In one embodiment VNN, a reference voltage for the circuit of FIG. 3, may be approximately 0V. In another embodiment, VNN may have a value of 1.8V, 1.0V, in relation to a zero-Volt reference of the circuit. For example, VNN may include a circuit to control a voltage potential on VNN. For example, VNN may include a transistor to a ground reference. VNN may also include a circuit that divides down a higher voltage, to a lower voltage. In general, VNN may be controlled to be a potential somewhere between 0V and the BVD potential of one or more devices of FIG. 3. Thus, VNN may be a controlled voltage, or a voltage potential that is controlled to be at a certain potential.

Note that transistor N322 has its gate tied to VPP. Thus, when VNN is 0V, N322 may be on, pulling node 340 to 0V. In traditional switching circuits, this may result in having 0V on the drain of transistor P301 and 12V on the gate of P301. If transistor P301 can withstand 12V VDG, then there may not be any problem with this. However, transistor P301 may have electrical characteristics that do not allow for a 12V $V_{DG}$ without experiencing reverse breakdown. Thus, transistor P302 may prevent the 0V from being on the drain of transistor P301. By biasing transistor P302 at some voltage $V_{BIASP}$ of bias signal bias_P 332, the source of transistor P302 at node 350 may have a potential of $V_{BIASP}+|V_{tP}|$ Volts. Controlling $V_{BIASP}$ to be close enough to VPP (e.g., 12V) may prevent a BVD condition on transistor P301, which will only have a $V_{DG}$ of $(VPP-V_{BIASP}+V_{tP})V$.

By making $V_{BIASP}$ close enough to VNN, the $V_{DG}$ of transistor P302 may likewise be made to avoid a BVD condition on transistor P302. For example, with a voltage potential of approximately 4V, 6V, etc., a BVD condition may be avoided on either P301 or P302, and thus be avoided for the high voltage switch. In one embodiment making $V_{BIASP}$ approximately equal to half the value of VPP may provide a proper bias to avoid BVD breakdowns. Alternatively, if half the value of VPP is still high enough to cause a BVD condition, one or more additional series elements with stepped bias voltages may be used, in addition to P302. For example, if VPP were 12V and the BVD threshold were approximately 5V, P302 may include two transistor devices, with the bottom device biased to approximately $4V-V_{tP}$, and the upper device biased to approximately $8V-V_{tP}$. Thus, no device should have more than approximately $4V\ |V_{DG}|$.

Figure 4:
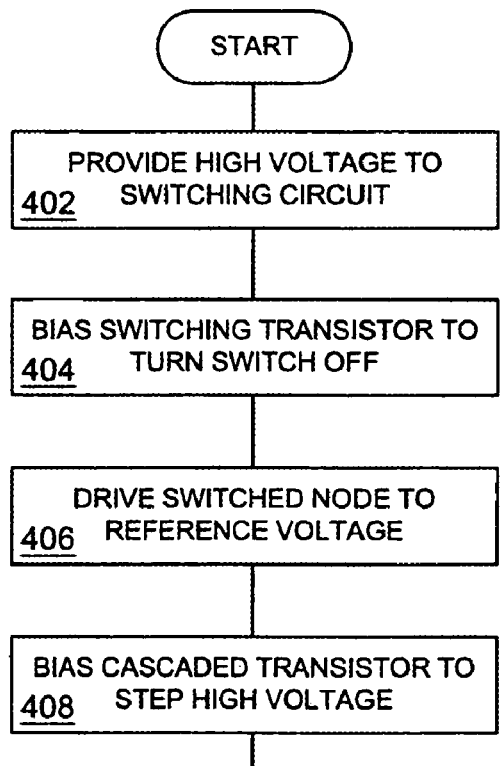
FIG. 4 is a flow diagram of providing a bias to a transistor in a switching circuit in accordance with an embodiment of the invention.

FIG. 4 is a flow diagram of providing a bias to a transistor in a switching circuit in accordance with an embodiment of the invention. A high voltage may be provided to a switching circuit, 402. The switching circuit may serve to keep the high voltage off circuitry that operates at the high voltage until the circuitry needs the high voltage to perform some operation. For example, certain memory circuits use high voltage for write operations. The voltage could be switched off by the switching circuit until a write operation will take place, at which point the high voltage may be switched onto the memory circuitry. The voltage may be switched off after the write is completed.

To turn the switching circuit on and off, a bias of a switching transistor may be used, 404. In one embodiment, the gate of a switching transistor is coupled to the high voltage to turn the switch off. The driven node may be driven by another circuit/circuit element to a reference voltage while the high voltage is not used, 406. This may be performed, for example, by a transistor that turns on to sink the driven node.

To prevent a BVD condition of the switching transistor caused by having the high voltage at the gate and the reference voltage at the drain, a transistor may be coupled with its source to the drain of the switching transistor, and the transistor may be biased to one or more intermediate voltage level(s) to reduce the risk of a BVD condition, 408. The transistor may be connected to thus step the high voltage across each individual transistor in the switch to a safe level with respect to a BVD value associated with the transistors.

Besides what is described herein, it will be appreciated that various modifications may be made to embodiments of the invention without departing from their scope. Therefore, the illustrations and examples herein should be construed in an illustrative, and not a restrictive sense. The scope of the invention should be measured solely by reference to the claims that follow.

What is claimed is:

1. A circuit for voltage switching in an integrated circuit, comprising:

a first p-type transistor having a source, a gate, a drain, and a substrate, the substrate coupled with the source, the source coupled with a high voltage potential line to receive a voltage potential that is higher than a gate-to-drain pn-junction breakdown voltage associated with the first transistor, and the gate coupled with a line to have a voltage potential substantially equal to the high voltage;

a second p-type transistor having a source, a gate, a drain, and a substrate, the substrate coupled with the source, the source coupled with a low voltage potential line, the low voltage controlled to be lower than the high voltage, the gate coupled with a control signal line, and the drain to have a voltage potential substantially equal to the low voltage, the difference between the high voltage and the voltage on the drain equal to or higher than the breakdown voltage; and a third p-type transistor having a source, a gate, a drain, and a substrate, the substrate coupled with the source of the first transistor, the source coupled with the drain of the first transistor, the drain coupled with the drain of the second transistor, and the gate coupled with a bias signal line to have a voltage potential between the high voltage and the voltage on the drain of the second transistor.

2. A circuit according to claim 1, wherein the high voltage potential comprises a voltage potential of approximately 12VDC.

3. A circuit according to claim 1, further comprising a transistor-based circuit to maintain the controlled low voltage potential lower than the high voltage.

4. A circuit according to claim 1, further comprising an n-type transistor with the source coupled to the low voltage, the drain coupled to the drain of the second p-type transistor, and the gate coupled to the high voltage potential to turn the n-type transistor on to pull the drain of the second p-type transistor to the voltage potential substantially equal to the low voltage.

5. A circuit according to claim 1, wherein the bias signal on the gate of the third transistor comprises a constant DC voltage of a value approximately halfway between the high voltage potential and the low voltage potential.

6. A device to supply a voltage to a circuit, comprising:
a switching circuit having a p-type voltage switching transistor with a source and a gate coupled in an off condition to a high voltage, a difference in potential between the high voltage and a reference voltage exceeding a drain-substrate inner pn-junction breakdown voltage of the transistor;
an additional p-type transistor with a drain coupled to a drain of the switching transistor, the drain of the additional p-type transistor being driven to the reference voltage; and
a voltage stepping transistor coupled between the drain of the switching transistor and the drain of the additional transistor, a gate of the stepping transistor to be biased in the off condition of the switching transistor to an intermediate voltage between the high voltage and the reference voltage, to prevent the reference voltage on drain of the additional transistor from being on the drain of the switching transistor; and
a biasing circuit coupled with the switching circuit to provide the bias voltage to the gate of the voltage stepping transistor.

7. A device according to claim 6, wherein the high voltage comprises a voltage of approximately 12VDC.

8. A device according to claim 6, wherein the breakdown voltage compnses a voltage of approximately 10VDC.

9. A device according to claim 6, further comprising the gate of the stepping transistor to be biased to the intermediate voltage in an on condition of the switching transistor.

10. A method for switching voltage, comprising:
supplying a voltage level to the source of a switching p-type transistor that is greater than a gate-aided reverse breakdown voltage of a drain-to-channel-substrate junction characteristic of the transistor, and supplying the voltage level to the gate of the switching transistor to generate an off condition;

supplying a low voltage level to the source of an additional p-type transistor in a back-to-back configuration with the switching transistor, and driving the drain to the low voltage; and biasing the gate of a third p-type transistor when the off condition is generated to turn the third transistor on, the third p-type transistor to couple the drain of the switching transistor with the drain of the additional transistor.

11. A method according to claim 10, wherein supplying the voltage level to the source of the switching transistor comprises supplying approximately 12 Volts direct current (VDC) to the source of the switching transistor.

12. A method according to claim 10, wherein supplying the voltage level to the source of the switching transistor that is greater than the reverse breakdown voltage comprises supplying the voltage level that is greater than approximately 10VDC.

13. A method according to claim 10, wherein supplying the low voltage level to the source of the additional transistor comprises supplying approximately 1.8 VDC to the source of the additional transistor.

14. A method according to claim 10, wherein supplying the low voltage level to the source of the additional transistor comprises supplying approximately 0VDC to the source of the additional transistor.

15. A method according to claim 10, wherein biasing the gate of the third transistor comprises supplying approximately 6VDC to the gate of the third transistor.

16. A method according to claim 10, further comprising biasing the gate of the third transistor to turn on the third transistor when the off condition is not generated.

17. A system comprising:
a switching circuit having
a p-type voltage switching transistor with a source and a gate coupled in an off condition to a high voltage, a difference in potential between the high voltage and a reference voltage exceeding a drain-substrate inner pn-junction breakdown voltage;
an additional p-type transistor with a drain coupled to a drain of the switching transistor, the drain of the additional p-type transistor being driven to the reference voltage; and
a voltage stepping transistor coupled between the drain of the switching transistor and the drain of the additional transistor, a gate of the stepping transistor to be biased in the off condition of the switching transistor to an intermediate voltage between the high voltage and the reference voltage, to prevent the reference voltage on drain of the additional transistor from being on the drain of the switching transistor; and
a memory array coupled with the switch to selectively be passed the high voltage through the switch.

18. A system according to claim 17, wherein the high voltage comprises a voltage of approximately 12VDC.

19. A system according to claim 17, wherein the intermediate voltage comprises a voltage of approximately 6VDC.

20. A system according to claim 17, wherein the memory array comprises a Flash memory element.

21. A system according to claim 17, further comprising a second voltage stepping transistor coupled between the drain of the additional transistor and the drain of the voltage stepping transistor, the gate of the second voltage stepping transistor to be biased in the off condition of the switching transistor to an intermediate voltage different than the intermediate voltage of the voltage stepping transistor, to prevent the reference voltage on the drain of the additional transistor from being on the drain of the voltage stepping transistor.

22. A system according to claim 21, wherein the intermediate voltage of the voltage stepping transistor is approximately two-thirds of the potential of the high voltage, and the intermediate voltage of the second voltage stepping transistor is approximately one-third of the potential of the high voltage.

* * * * *